(12) United States Patent
Chao et al.

(10) Patent No.: US 9,214,500 B2
(45) Date of Patent: Dec. 15, 2015

(54) PIXEL STRUCTURE OF ELECTROLUMINESCENT DISPLAY PANEL

(71) Applicant: AU Optronics Corp., Hsin-Chu (TW)

(72) Inventors: Ching-Yan Chao, Hsin-Chu (TW); Chin-Yu Chang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 208 days.

(21) Appl. No.: 14/154,188

(22) Filed: Jan. 14, 2014

(65) Prior Publication Data

US 2014/0198479 A1  Jul. 17, 2014

(30) Foreign Application Priority Data

Jan. 15, 2013  (TW) .............................. 102101516 A

(51) Int. Cl.
*F21K 2/00* (2006.01)
*H01L 27/32* (2006.01)

(52) U.S. Cl.
CPC .................................. *H01L 27/3218* (2013.01)

(58) Field of Classification Search
CPC .................................................. H01L 27/3218
USPC .......................................................... 362/84
See application file for complete search history.

(56) References Cited

U.S. PATENT DOCUMENTS

| 6,518,709 B2* | 2/2003 | Iketsu .................. G09G 3/3216 313/505 |
| 7,333,080 B2 | 2/2008 | Miller |
| 7,663,299 B2 | 2/2010 | Chao |
| 2007/0024183 A1* | 2/2007 | Lih ......................... H01L 51/56 313/504 |
| 2009/0121983 A1 | 5/2009 | Sung |

FOREIGN PATENT DOCUMENTS

| TW | 200603051 | 1/2006 |
| TW | I258721 | 7/2006 |

* cited by examiner

*Primary Examiner* — David V Bruce
(74) *Attorney, Agent, or Firm* — Winston Hsu; Scott Margo

(57) ABSTRACT

A pixel structure of an electroluminescent display panel includes display pixel units. Each display pixel unit is composed of one first sub-pixel, one second sub-pixel, and one third sub-pixel. Each first sub-pixel is disposed adjacent to another first sub-pixel along a column direction to form a first pixel unit with a first frame. Each second sub-pixel is disposed adjacent to another second sub-pixel along the column direction to form a second pixel unit with a second frame. Each third sub-pixel is disposed adjacent to another third sub-pixel along the column direction to form a third pixel unit with a third frame. Each first, second, and third pixel units respectively have an identical first length along the column direction. Each first pixel unit and one adjacent first pixel unit disposed in a different row are shifted relatively along the row direction by the first length.

23 Claims, 12 Drawing Sheets

PIXEL STRUCTURE OF ELECTROLUMINESCENT DISPLAY PANEL

BACKGROUND OF THE INVENTION

1. Field of the Invention

The present invention relates to a pixel structure of an electroluminescent display panel, and more particularly, to the pixel structure with the higher aperture ratio and the higher alignment tolerance by adjusting the arrangement of the sub-pixels.

2. Description of the Prior Art

Without a color filter but with the advantage of self-luminous characteristic (i.e., without a backlight module) and low power consumption, an organic electroluminescent display has been regarded as a promising candidate to replace LCD display technology for the next generation display technology for long.

Please refer to FIGS. 1 and 2. FIG. 1 is a schematic diagram illustrating a conventional pixel structure of an organic electroluminescent display panel. FIG. 2 is a schematic diagram illustrating a conventional shadow mask. As shown in FIGS. 1 and 2, the shadow mask 100M with a plurality of stripe openings 100H extending along a column direction Y is employed to perform a vapor deposition process of organic luminescent materials in the manufacturing process of the pixel structure 100 of the conventional organic electroluminescent display panel so as to form a plurality of blue sub-pixels 120B, a plurality of green sub-pixels 120G and a plurality of red sub-pixels 120R on a substrate 110. Each of the blue sub-pixels 120B, each of the green sub-pixels 120G and each of the red sub-pixels 120R are alternately disposed in a row direction X. Each of the display pixel units 120 is composed of one of the blue sub-pixels 120B, one of the green sub-pixels 120G and one of the red sub-pixels 120R disposed adjacent to one another along the row direction X. The blue sub-pixels 120B in each column, the green sub-pixels 120G in each column and the red sub-pixels 120R in each column, which are adjacent to each other along the column direction Y, are respectively formed through one single stripe opening 100H on the shadow mask 100M by vapor deposition processes of different organic luminescent materials. This kind of arrangement of the sub-pixels is generally referred to as a stripe pixel arrangement structure. In this structure, according to alignment precision and fabrication variation of the vapor deposition process, there must be enough space among the sub-pixels to prevent the materials from being mixed in the vapor deposition process and affecting the manufacturing yield. Relatively, there must be enough space among the openings 100H on the shadow mask 100M to ensure enough structure strength. Accordingly, the distribution density of the sub-pixels, in this condition, is limited, thereby restricting the resolution. Moreover, the aperture ratio of each of sub-pixels and the fabrication of the shadow mask 100M are affected negatively.

SUMMARY OF THE INVENTION

It is one of the objectives of the invention to provide a pixel structure of an electroluminescent display panel, thereby increasing the aperture ratio and the alignment tolerance in a vapor deposition process by adjusting the arrangement of the sub-pixels.

To achieve the purposes described above, an embodiment of the invention provides a pixel structure of an electroluminescent display panel. The pixel structure of the electroluminescent display panel includes a substrate and a plurality of display pixel units. The display pixel units are disposed on the substrate. Each of the display pixel units is composed of a first sub-pixel, a second sub-pixel and a third sub-pixel. The first sub-pixel, the second sub-pixel and the third sub-pixel are arranged in a delta arrangement. The first sub-pixel of each of the display pixel units is disposed adjacent to one first sub-pixel of an adjacent display pixel unit in a column direction. Two of the first sub-pixels adjacent to each other compose a first pixel unit. The second sub-pixel of each of the display pixel units is disposed adjacent to the second sub-pixel of the adjacent display pixel unit in the column direction. Two of the second sub-pixels adjacent to each other compose a second pixel unit. The third sub-pixel of each of the display pixel units is disposed adjacent to one third sub-pixel of an adjacent display pixel unit in the column direction. Two of the third sub-pixels adjacent to each other compose a third pixel unit. Each of the first pixel units, each of the second pixel units and each of the third pixel units respectively have a first length identical to one another along the column direction. The first pixel units disposed in any two different rows are shifted relatively along a row direction by the first length.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, features of the embodiments will be made in detail. The embodiments of the present invention are illustrated in the accompanying drawings with numbered elements.

Figure 3:
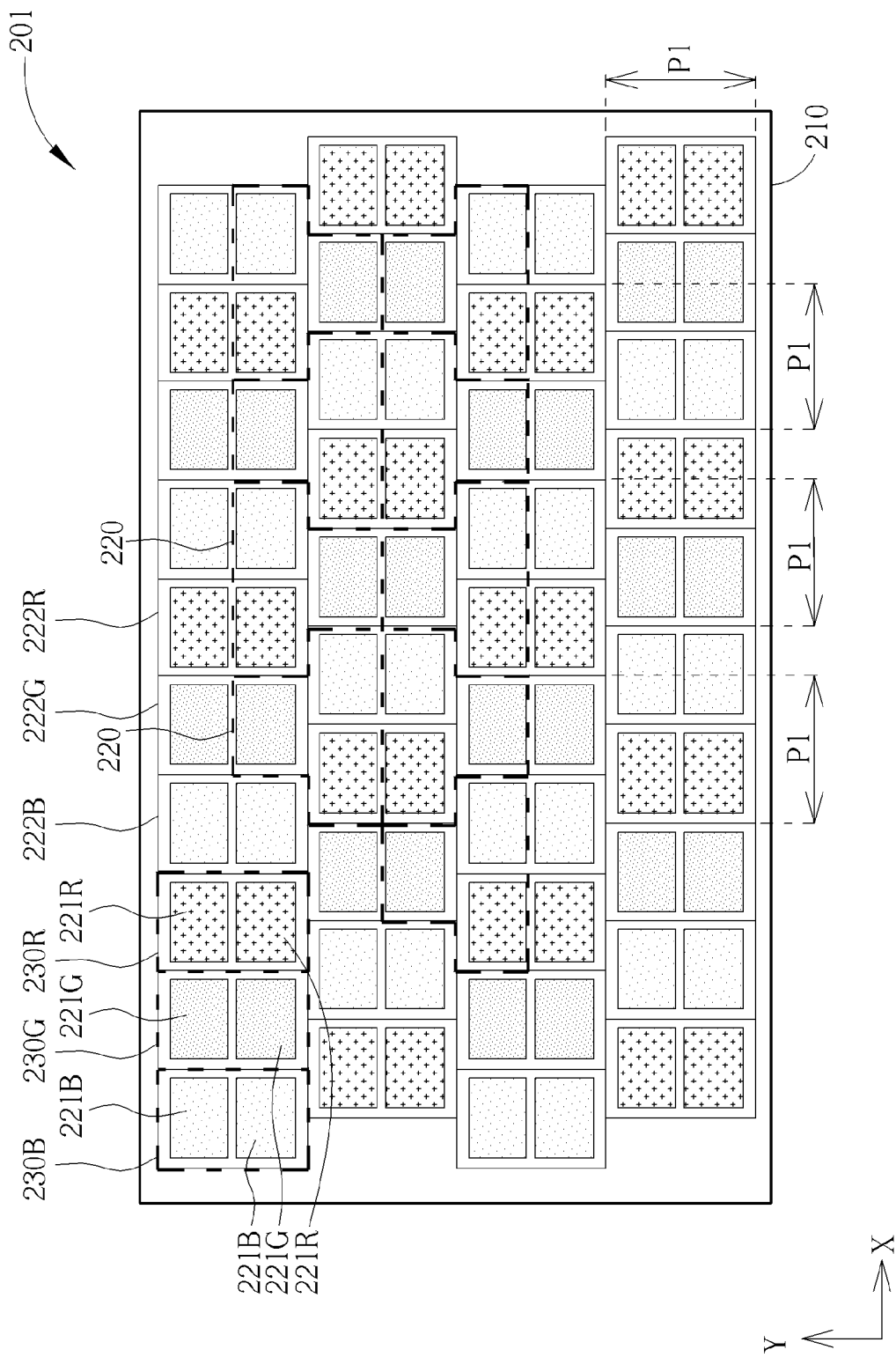
FIG. 3 is a schematic diagram illustrating a pixel structure of an electroluminescent display panel according to a first embodiment of the present invention.
Figure 4:
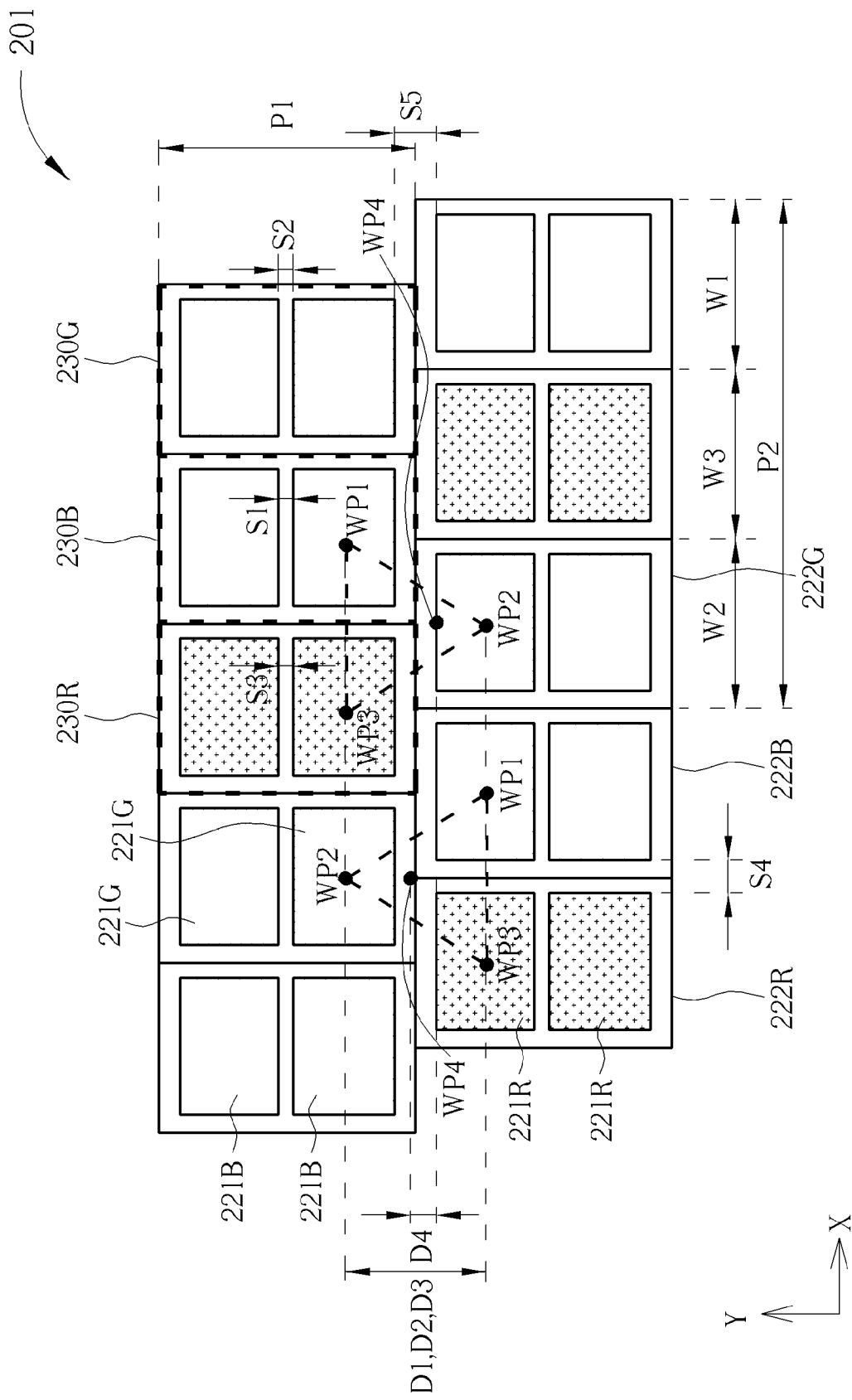
FIG. 4 is a schematic diagram illustrating a locally enlarged view of the pixel structure of the electroluminescent display panel according to the first embodiment.
Figure 5:
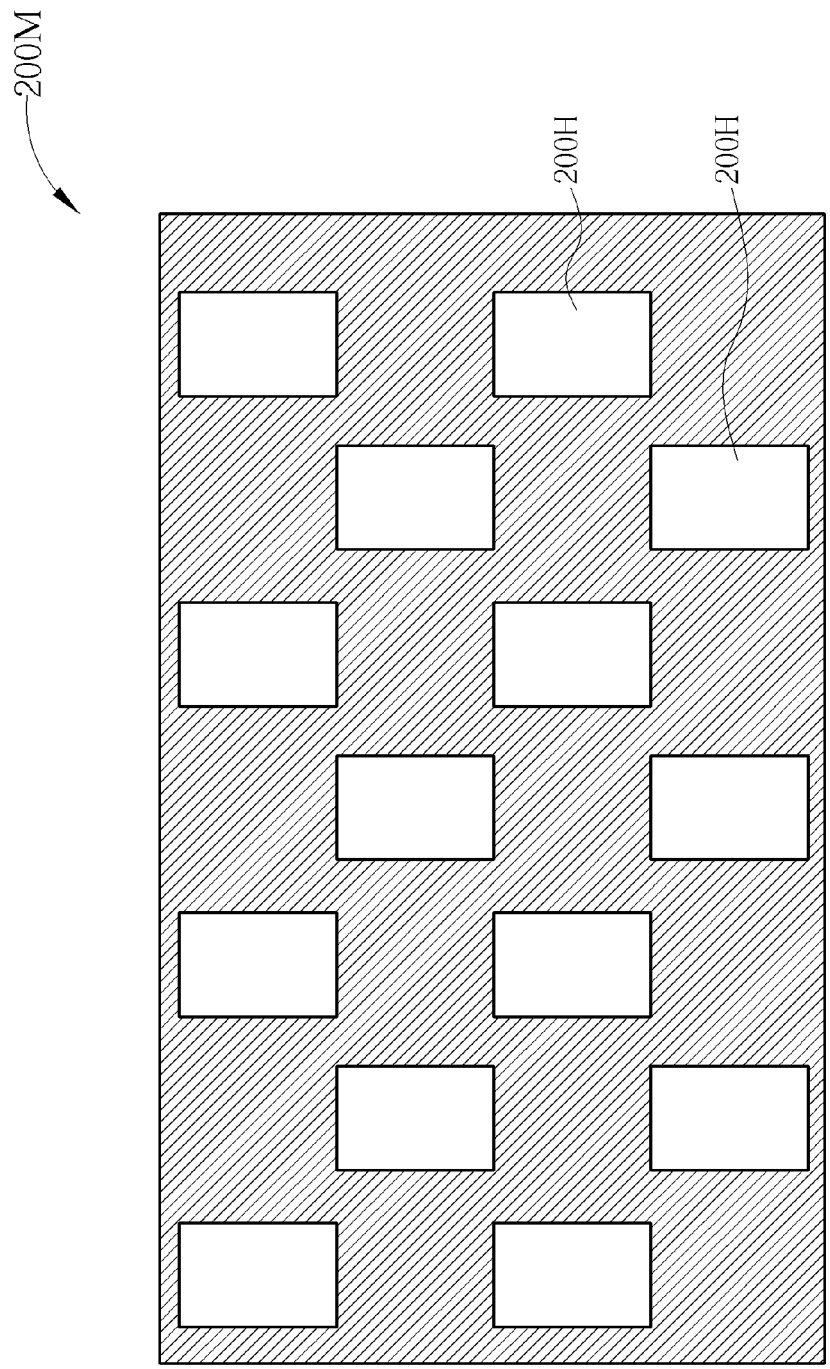
FIG. 5 is a schematic diagram illustrating a shadow mask according to the first embodiment.
Figure 6:
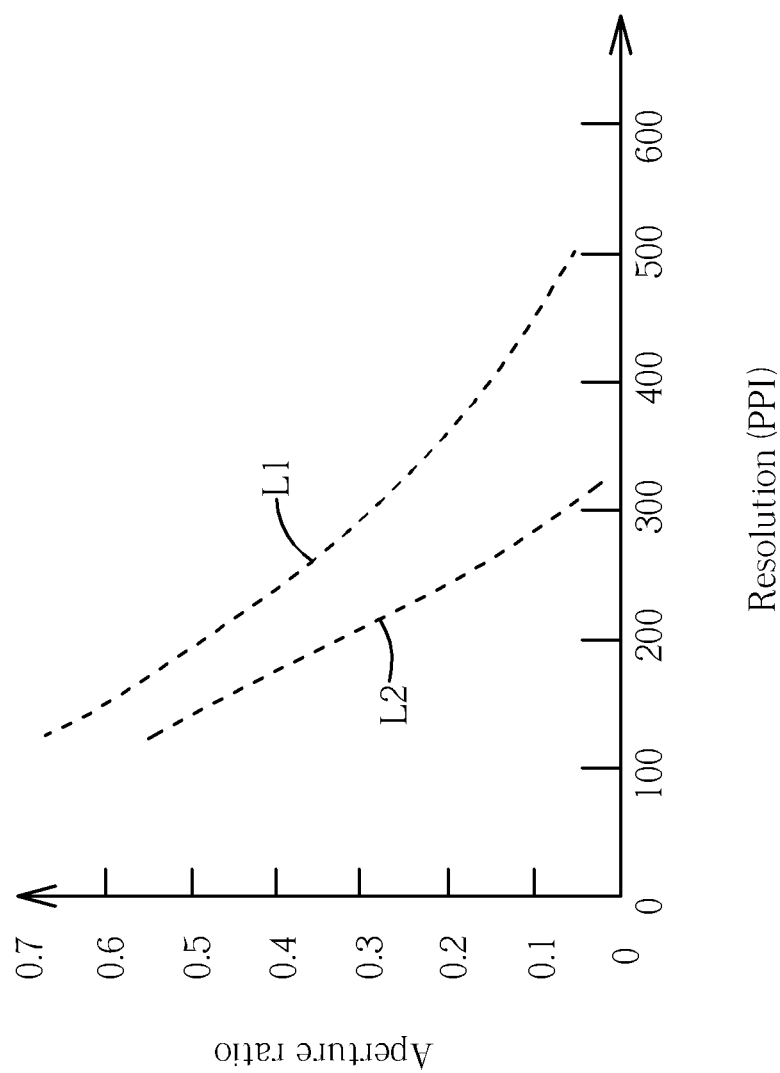
FIG. 6 is a comparison diagram illustrating the relation curve between the resolution and the aperture ratio of the pixel structure in the electroluminescent display panel according to the first embodiment and the relation curve between the resolution and the aperture ratio of the pixel structure according to a control group.
Figure 7:
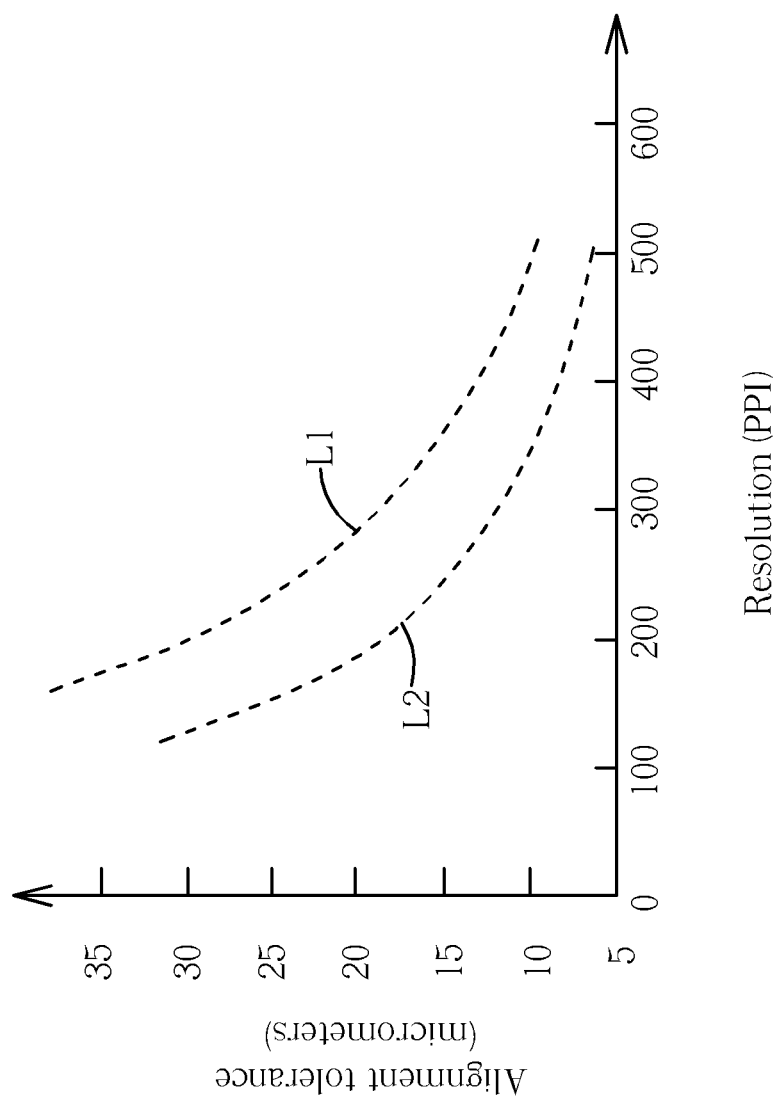
FIG. 7 is a comparison diagram illustrating the relation curve between the resolution and the alignment tolerance of the pixel structure in the electroluminescent display panel according to the first embodiment and the relation curve between the resolution and the alignment tolerance of the pixel structure according to a control group.

Please refer to FIGS. 3-7. FIG. 3 is a schematic diagram illustrating a pixel structure of an electroluminescent display panel according to a first embodiment of the present invention. FIG. 4 is a schematic diagram illustrating a locally enlarged view of the pixel structure of the electroluminescent display panel according to the first embodiment. FIG. 5 is a schematic diagram illustrating a shadow mask according to the first embodiment. FIG. 6 is a comparison diagram illustrating the relation curve between the resolution and the aperture ratio of the pixel structure in the electroluminescent display panel according to the first embodiment and the relation curve between the resolution and the aperture ratio of the pixel structure according to a control group. FIG. 7 is a comparison diagram illustrating the relation curve between the resolution and the alignment tolerance of the pixel structure in the electroluminescent display panel according to the first embodiment and the relation curve between the resolution and the alignment tolerance of the pixel structure according to a control group. For brevity purposes, please note that the figures are only for illustration and the figures may not be to scale. The scale may be further modified according to different design considerations. As shown in FIGS. 3-5, the pixel structure 201 of the electroluminescent display panel provided in this embodiment includes a substrate 210 and a plurality of display pixel units 220. The display pixel units 220 are disposed on the substrate 210. Each of the display pixel units 220 is composed of a first sub-pixel 221B, a second sub-pixel 221G and a third sub-pixel 221R. The first sub-pixel 221B, the second sub-pixel 221G and the third sub-pixel 221R of each of the display pixel units 220 are arranged in a delta arrangement. The display pixel units 220 are arranged by alternate regular delta arrangement and inverted delta arrangement in a row direction X, but not limited thereto. The first sub-pixel 221B of each of the display pixel units 220 is disposed adjacent to the first sub-pixel 221B of an adjacent display pixel unit 220 in a column direction Y (i.e., the first sub-pixel 221B of the adjacent display pixel unit 220 along a column direction Y). Two of the first sub-pixels 221B adjacent to each other (i.e., the two mutually adjacent first sub-pixels 221B) compose a first pixel unit 230B. The second sub-pixel 221G of each of the display pixel units 220 is disposed adjacent to the second sub-pixel 221G of an adjacent display pixel unit 220 in the column direction Y. Two of the second sub-pixels 221G adjacent to each other compose a second pixel unit 230G. The third sub-pixel 221R of each of the display pixel units 220 is disposed adjacent to the third sub-pixel 221R of an adjacent display pixel unit 220 in the column direction Y. Two of the third sub-pixels 221R adjacent to each other compose a third pixel unit 230R. The column direction Y is preferably perpendicular to the row direction X. The first frame 222B surrounds the two first sub-pixels 221B adjacent to each other. The second frame 222G surrounds the second sub-pixel 221G adjacent to each other. The third frame 222R surrounds the third sub-pixel 221R adjacent to each other. Moreover, each of the first sub-pixels 221B, each of the second sub-pixels 221G and each of the third sub-pixels 221R preferably comprise a rectangle sub-pixel respectively. Each of the first pixel units 230B, each of the second pixel units 230G and each of the third pixel units 230R are preferably a rectangle pixel unit respectively. It is worth noting that the four edges are eased by rounding or chamfering to form a round or chamfer respectively because of the limitation or variation of fabrication or other consideration, but not limited thereto. In other embodiments, the shape of each of the first pixel units 230B, each of the second pixel units 230G, each of the third pixel units 230R, the first frame 222B, the second frame 222G and the third frame 222R may be a circle, a polygon (for example, a triangle, a diamond/rhombus, a quadrangle, a trapezoid, a pentagon, a hexagon or other suitable shapes), an arc/curve or other suitable shapes. At least one edge of the polygon may be eased by rounding or chamfering to form a round or chamfer, but not limited thereto. It is worth noting that the frames, such as the first frame 222B, the second frame 222G and the third frame 222R, are substantially regarded as non-luminous regions. The sub-pixels, such as each of the first sub-pixels 221B, each of the second sub-pixels 221G and each of the third sub-pixels 221R are substantially regarded as luminous regions. The non-luminous regions surround the luminous regions.

Each of the first pixel units 230B, each of the second pixel units 230G and each of the third pixel units 230R respectively have a first length P1 identical to one another along the column direction Y. Each of the first pixel units 230B and the first pixel unit 230B disposed adjacently in an adjacent row are shifted relatively along the row direction X by the first length P1. Each of the second pixel units 230G and the second pixel unit 230G disposed adjacently in an adjacent row are shifted relatively along the row direction X by the first length P1. Each of the third pixel units 230R and the third pixel unit 230R disposed adjacently in an adjacent row are shifted relatively along the row direction X by the first length P1. Furthermore, each of the first pixel units 230B, the adjacent second pixel unit 230G along the row direction X and the third pixel unit 230R adjacent to the second pixel unit 230G along the row direction X constitute a second length P2 in row direction X, and the second length P2 is twice as long as the first length P1, but not limited thereto. It is worth noting that each of the first pixel units 230B preferably partially neighbors with the second pixel unit 230G adjacent to the first pixel unit 230B and partially neighbors with the third pixel unit 230R adjacent to the first pixel unit 230B along the column direction Y. Each of the second pixel units 230G preferably partially neighbors with the first pixel unit 230B adjacent to the second pixel unit 230G and partially neighbors with the third pixel unit 230R adjacent to the second pixel unit 230G along the column direction Y. Each of the third pixel units 230R preferably partially neighbors with the first pixel unit 230B adjacent to the third pixel unit 230R and partially neighbors with the second pixel unit 230G adjacent to the third pixel unit 230R along the column direction Y. In other words, the first sub-pixels 221B, which are disposed in the adjacent rows and belong to different first pixel units 230B, are preferably shifted relatively along the row direction X. The second sub-pixel 221G, which are disposed in the adjacent rows and belong to different second pixel unit 230G, is preferably shifted relatively along the row direction X. The second sub-pixel 221G, which are disposed in the adjacent rows and belong to different third pixel unit 230R, is preferably shifted relatively along the row direction X. As a result, the first sub-pixel 221B, the second sub-pixel 221G and the third sub-pixel 221R of each of the display pixel units 220 are closely disposed and arranged in the delta arrangement.

Figure 1:
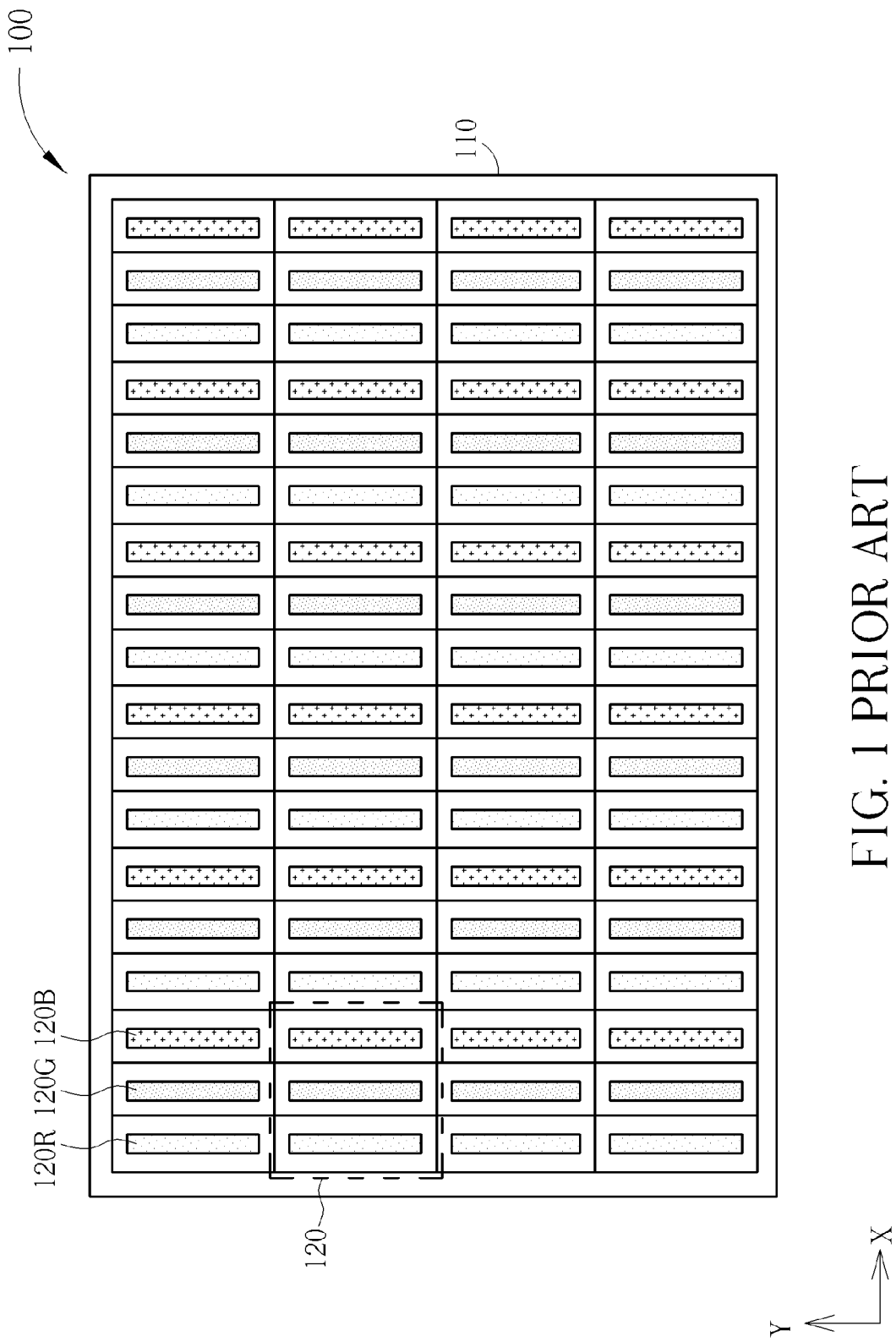
FIG. 1 is a schematic diagram illustrating a conventional pixel structure of an organic electroluminescent display panel.
Figure 2:
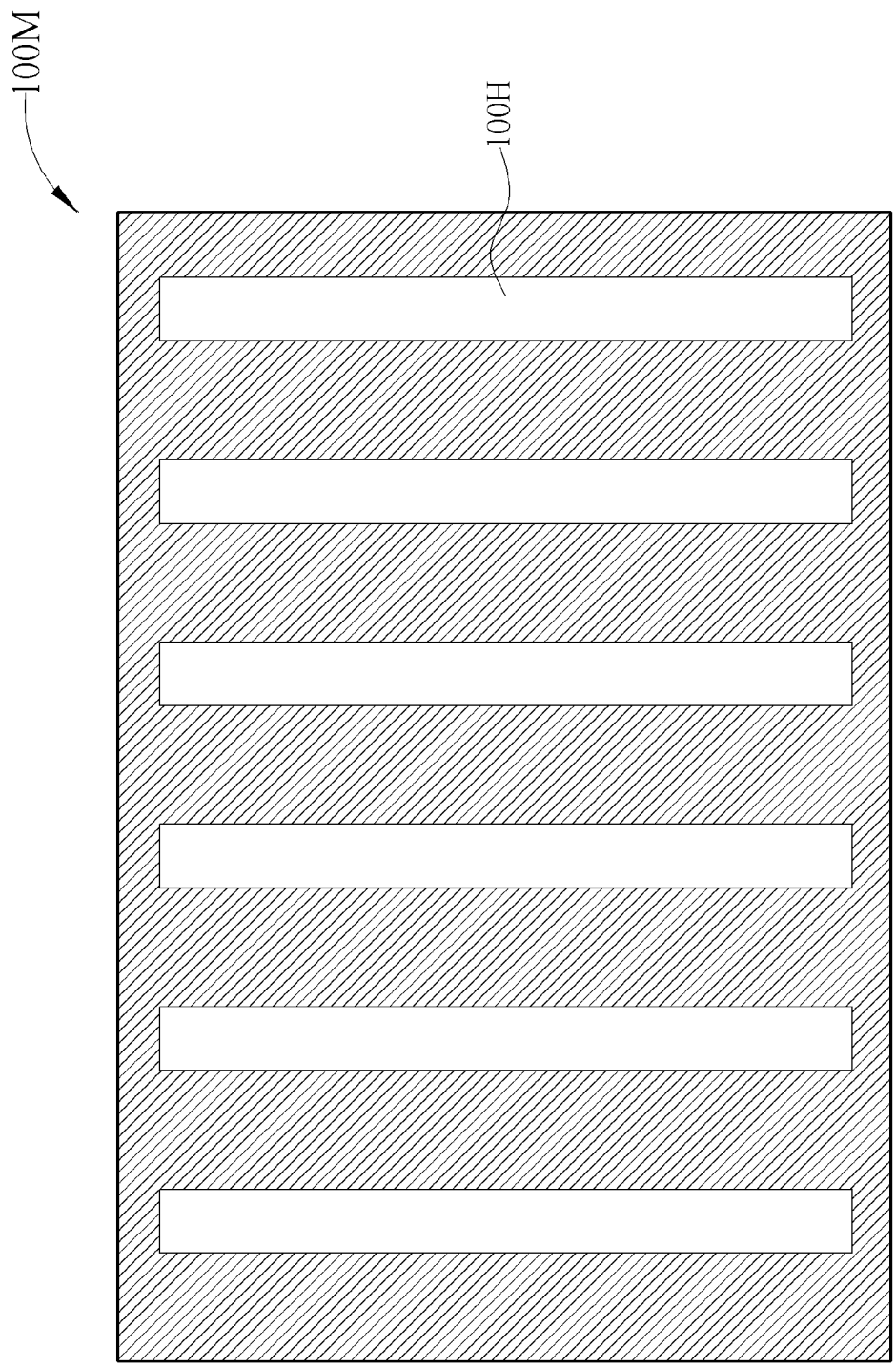
FIG. 2 is a schematic diagram illustrating a conventional shadow mask.

In the pixel structure 201 of the electroluminescent display panel in this embodiment, each of the first pixel units 230B, each of the second pixel units 230G and each of the third pixel units 230R can be formed by performing evaporation processes of different luminous materials, such as organic luminescent materials, through the opening 200H on the shadow mask 200M. In other words, each of the openings 200H can be employed to form one of the first pixel units 230B, one of the second pixel units 230G or one of the third pixel units 230R. With the arrangement of each of the first pixel units 230B, each of the second pixel units 230G and each of the third pixel units 230R in this embodiment, both the aperture ratio of the sub-pixel and the alignment tolerance of the shadow mask 200M increase compared with the prior art shown in FIG. 1 and FIG. 2. The width of each of the openings 200H on the shadow mask 200M are broadened, and the difficulty of fabricating the shadow mask 200M is reduced. For example, as shown in FIG. 6, Table 1, FIG. 7 and Table 2, the curve L1 represents the pixel structure of the electroluminescent display panel in this embodiment. The curve L2 represents a conventional stripe pixel structure serving as a control group. Compared with the conventional stripe pixel structure, the aperture ratio in the pixel structure of the electroluminescent display panel of this embodiment increases and the alignment tolerance is enhanced under the same solution requirements.

TABLE 1

| PPI | the aperture ratio in L1 | the aperture ratio in L2 |
| --- | --- | --- |
| 120 | 0.67 | 0.55 |
| 150 | 0.59 | 0.46 |
| 200 | 0.48 | 0.31 |
| 257 | 0.37 | 0.16 |
| 300 | 0.29 | 0.05 |
| 326 | 0.25 | 0.00 |
| 350 | 0.21 | 0.00 |
| 400 | 0.15 | 0.00 |
| 450 | 0.10 | 0.00 |
| 500 | 0.05 | 0.00 |

TABLE 2

| PPI | the alignment tolerance in L1 (micrometer, μm) | the alignment tolerance in L2 (μm) |
| --- | --- | --- |
| 120 | 48.5 | 29.65 |
| 150 | 38.4 | 23.65 |
| 200 | 28.3 | 17.63 |
| 257 | 21.6 | 13.63 |
| 300 | 18.1 | 11.61 |
| 326 | 16.5 | 10.65 |
| 350 | 15.2 | 9.88 |
| 400 | 13.0 | 8.59 |
| 450 | 11.2 | 7.58 |
| 500 | 9.8 | 6.76 |

Furthermore, as shown in FIGS. 3 and 4, the center of each of the first pixel units 230B is aligned with the center of the second pixel unit 230G adjacent to the first pixel unit 230B and the center of the third pixel unit 230R adjacent to the first pixel unit 230B in the row direction X. Each of the first pixel units 230B, each of the second pixel units 230G and each of the third pixel units 230R have a first width W1, a second width W2 and a third width W3 along the row direction X respectively. In this embodiment, preferably, the first width W1, the second width W2 and the third width W3 are substantially equal. In other words, preferably, each of the first pixel units 230B, each of the second pixel units 230G and each of the third pixel units 230R have an identical width substantially along the row direction X. Preferably, each of the first pixel units 230B, each of the second pixel units 230G and each of the third pixel units 230R have an identical area substantially, but not limited thereto. Moreover, the first sub-pixel 221B, the second sub-pixel 221G and the third sub-pixel 221R are preferably sub-pixels of different colors respectively. For example, each of the first sub-pixels 221B is preferably a blue sub-pixel, each of the second sub-pixels 221G is preferably a green sub-pixel, and each of the third sub-pixels 221R is preferably a red sub-pixel. However, the present invention is not limited to this and sub-pixels of other different colors may also be employed to achieve the desire effects according to other considerations. In addition, there is a first spacing S1 between two of the first sub-pixels 221B (i.e., the two first sub-pixels 221B) of each of the first pixel units 230B. There is a second spacing S2 between two of the second sub-pixels 221G of each of the second pixel units 230G. There is a third spacing S3 between two of the third sub-pixels 221R of each of the third pixel units 230R. If the first sub-pixel 221B, the second sub-pixel 221G and the third sub-pixel 221R are respectively a blue sub-pixel, a green sub-pixel and a red sub-pixel, the second spacing S2 is preferably wider than or substantially equal to the third spacing S3, and the third spacing S3 is preferably wider than or substantially equal to the first spacing S1 so as to adjust the display effect relating to the color mixing of the white light and the pixel color center of the white light in each of the display pixel units 220, but not limited thereto. Moreover, there is a fourth spacing S4 between each of the first sub-pixels 221B and the second sub-pixel 221G adjacent to the first sub-pixel 221B along the row direction X (i.e., the adjacent second sub-pixel 221G along the row direction X) or between each of the first sub-pixels 221B and the third sub-pixel 221R adjacent to the first sub-pixel 221B along the row direction X (i.e., the adjacent third sub-pixel 221R along the row direction X). There is a fifth spacing S5 between each of the first sub-pixels 221B and the second sub-pixel 221G adjacent to the first sub-pixel 221B along the column direction Y (i.e., the adjacent second sub-pixel 221G along the column direction Y) or between each of the first sub-pixels 221B and the third sub-pixel 221R adjacent to the first sub-pixel 221B along the column direction Y (i.e., the adjacent third sub-pixel 221R along the column direction Y). The first spacing S1 is preferably smaller than the fourth spacing S4, and the first spacing S1 is preferably smaller than the fifth spacing S5.

In this embodiment, the first spacing S1, the second spacing S2 and the third spacing S3 are substantially equal, but not limited thereto. In addition, each of the first sub-pixels 221B in this embodiment has a first color center WP1. Each of the second sub-pixels 221G in this embodiment has a second color center WP2. Each of the third sub-pixels 221R in this embodiment has a third color center WP3. Each of the display pixels units 220 in this embodiment has a pixel color center WP4. If the size of the first sub-pixel 221B, the second sub-pixel 221G and the third sub-pixel 221R are substantially equal, and if the first sub-pixel 221B, the second sub-pixel 221G and the third sub-pixel 221R are respectively a blue sub-pixel, a green sub-pixel and a red sub-pixel, the pixel color center WP4 of each of the display pixel units 220 comes closer to the second sub-pixel 221G. Because the first sub-pixel 221B, the second sub-pixel 221G and the third sub-pixel 221R of each of the display pixel units 220 are arranged in a delta arrangement, and because the display pixel units 220 are arranged by alternate regular delta arrangement and inverted delta arrangement along the row direction X, the pixel color centers WP4 of two of the display pixel units 220 adjacent to each other along the row direction X (i.e., the two adjacent display pixel units 220 along the row direction X) are shifted relatively along the column direction Y. In other words, there is a first distance D1 along the column direction Y between two of the first color centers WP1 in two of the display pixel units 220 adjacent to each other along the row direction X (i.e., the two first color centers WP1 in the two adjacent display pixel units 220 along the row direction X). There is a second distance D2 along the column direction Y between two of the second color centers WP2 in two of the display pixel units 220 adjacent to each other along the row direction X (i.e., the two second color centers WP2 in the two adjacent display pixel units 220 along the row direction X). There is a third distance D3 along the column direction Y between two of the third color centers WP3 in two of the display pixel units 220 adjacent to each other along the row direction X (i.e., the two third color centers WP3 in the two adjacent display pixel units 220 along the row direction X). The second distance D2 is preferably shorter than or substantially equal to the third distance D3. The third distance D3 is preferably shorter than or substantially equal to the first distance D1. If the first distance D1, the second distance D2 and the third distance D3 are substantially equal, the two pixel color centers WP4 of the two adjacent display pixel units 220 along the row direction X are shifted relatively along the column direction Y by a fourth distance D4. In the pixel structure 201 of the electroluminescent display panel in this embodiment, the relation among the first spacing S1, the second spacing S2 and the third spacing S3 can be modified according to other considerations. Alternatively, the relation among the first distance D1, the second distance D2 and the third distance D3 may be modified so that the pixel color center WP4, which may also be regarded as a white color center, of each of the display pixel units 220 can be adjusted to achieve the desired display effects.

Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 8:
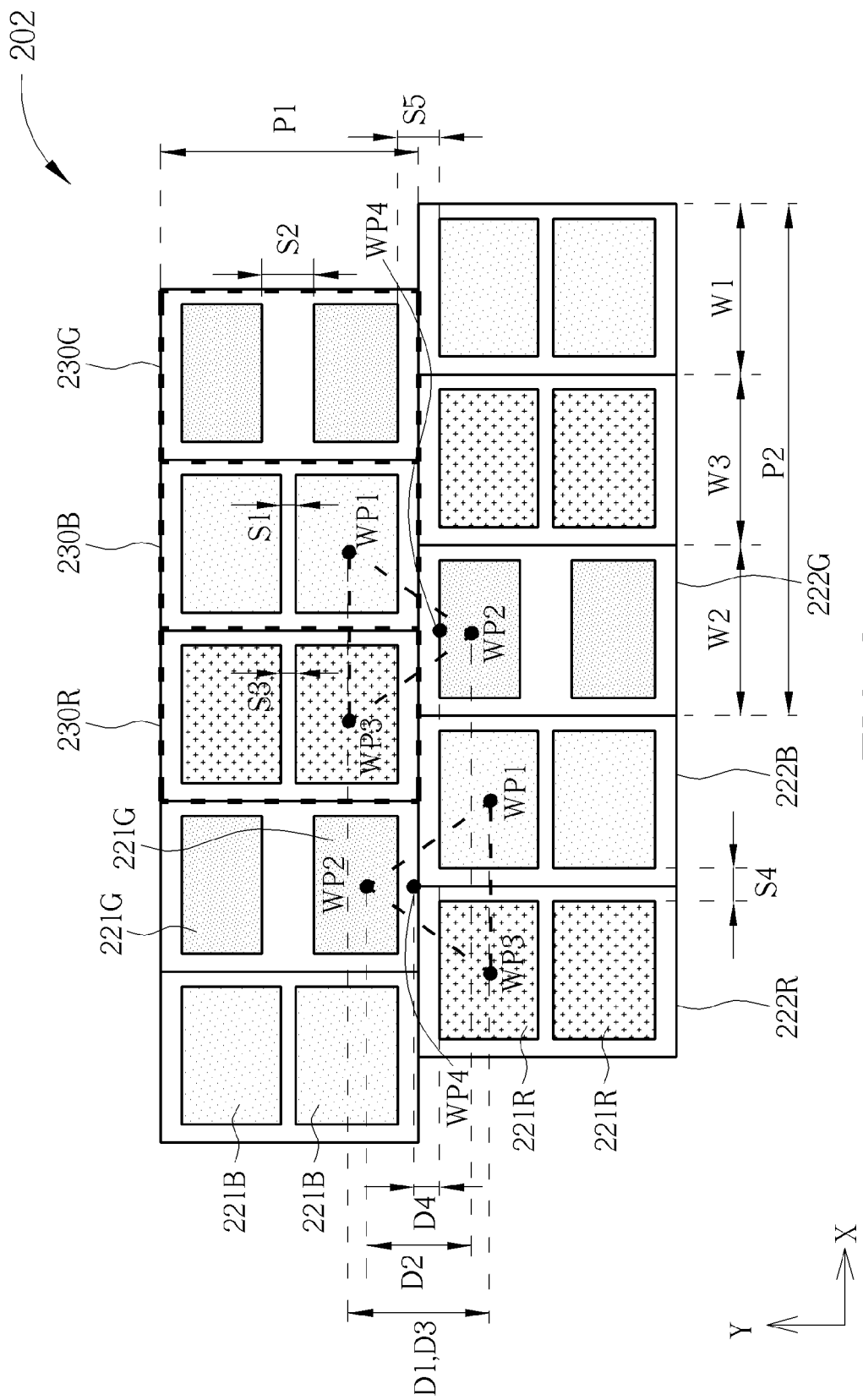
FIG. 8 is a schematic diagram illustrating a pixel structure of an electroluminescent display panel according to a second embodiment of the present invention.
Figure 9:
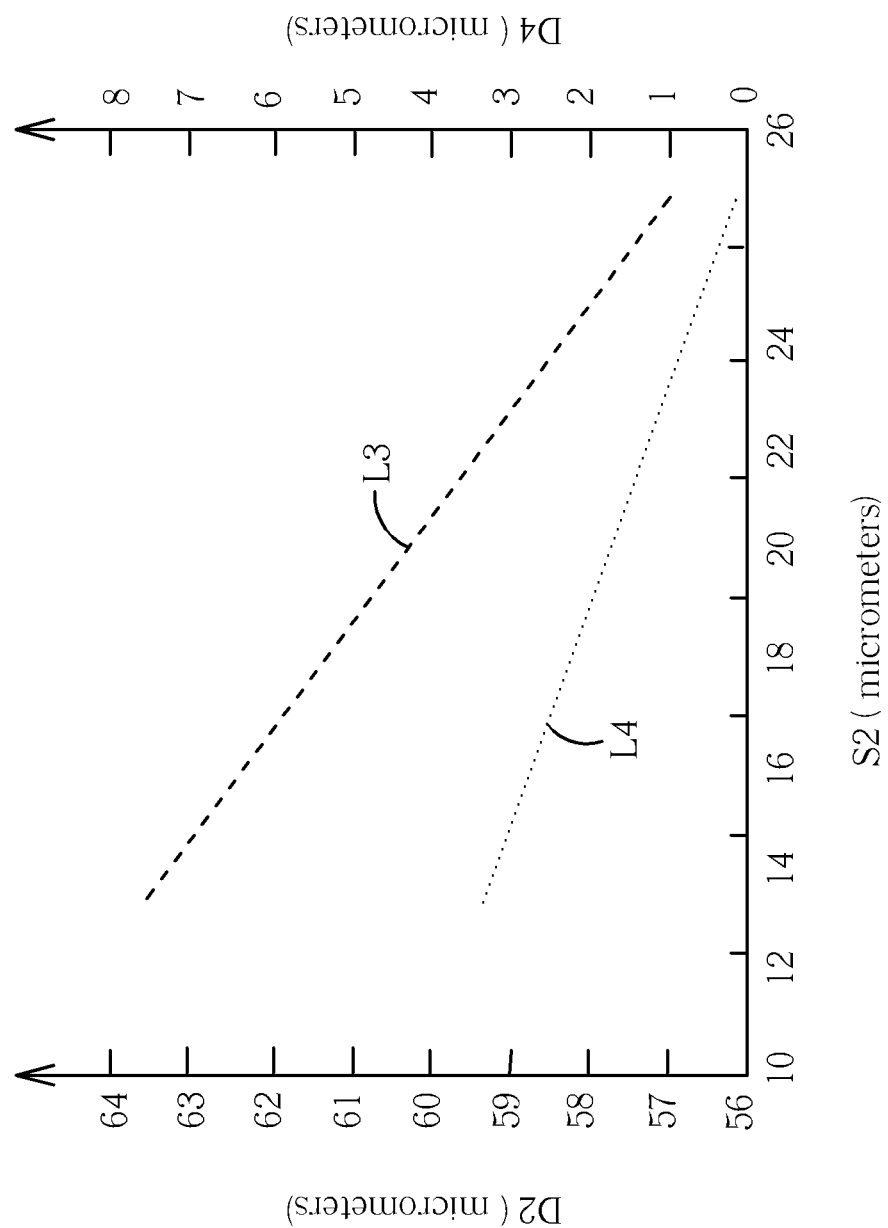
FIG. 9 is a diagram illustrating the relation between the second spacing and the pixel color center of the pixel structure of the electroluminescent display panel according to the second embodiment.

Please refer to FIGS. 8 and 9. FIG. 8 is a schematic diagram illustrating a pixel structure of an electroluminescent display panel according to a second embodiment of the present invention. FIG. 9 is a diagram illustrating the relation between the second spacing and the pixel color center of the pixel structure of the electroluminescent display panel according to the second embodiment. As shown in FIG. 8, the difference between the pixel structure 202 of the electroluminescent display panel in this embodiment and that in the first embodiment is that the second spacing S2 is preferably wider than the third spacing S3 and the first spacing S1 so that the second distance D2, which exists along the column direction Y between two of the second color centers WP2 in two of the display pixel units 220 adjacent to each other (the two second color centers WP2 in the two adjacent display pixel units 220) along the row direction X, is shorter than the first distance D1 and the third distance D3. By this means, the fourth distance D4, by which the two pixel color centers WP4 of the two adjacent display pixel units 220 along the row direction X are shifted relatively along the column direction Y, is shortened and the relative shift condition of the pixel color centers WP4 of each of the display pixel units 220 is improved. As shown in FIGS. 8 and 9, in the case that the resolution is 257 ppi (pixel per inch) and that the first spacing S1 and the third spacing S3 are respectively about 13 micrometers, the line L3 represents the relation between the second spacing S2 and the second distance D2, and the line L4 represents the relation between the second spacing S2 and the fourth distance D4. As shown in FIG. 9 and Table 3, as the second spacing S2 is broadened, the second distance D2 is shortened. At the same time, the fourth distance D4, by which the two pixel color centers WP4 of the two adjacent display pixel units 220 along the row direction X are shifted relatively along the column direction Y, is shortened and even approaches zero—that is to say, the two pixel color centers WP4 of the two adjacent display pixel units 220 along the row direction X are substantially aligned along a straight line parallel to the row direction X. In terms of the display quality, the smaller the second distance D2 and the fourth distance D4 are, the better the display quality to display a line and the less obvious the jagged edge is. Theoretically, the wider the second spacing S2, the shorter the second distance D2 and the fourth distance D4, thereby achieving better display quality. In practical, as the second spacing S2 becomes wider, the life duration of the second sub-pixel 221G is shorten because the aperture ratio decreases. Therefore, preferably, the second spacing S2 is wider than or substantially equal to the first spacing S1 while the second spacing S2 is less than three times the first spacing S1. More preferably, the second spacing S2 is wider than or substantially equal to the first spacing S1 while the second spacing S2 is less than two times the first spacing S1. It is worth noting that the aforementioned adjustment approaches focus on the adjustment of the second sub-pixel 221G, but the present invention is not limited to this and the size and the color centers of the sub-pixels of other colors may be modified as well to achieve the required effects.

TABLE 3

| S2 (μm) | L3 (μm) | L4 (μm) |
|---------|---------|---------|
| 13 | 63 | 3.2 |
| 15 | 62 | 2.7 |
| 17 | 61 | 2.2 |
| 19 | 60 | 1.6 |
| 21 | 59 | 1.1 |
| 23 | 58 | 0.6 |
| 25 | 57 | 0.1 |

Figure 10:
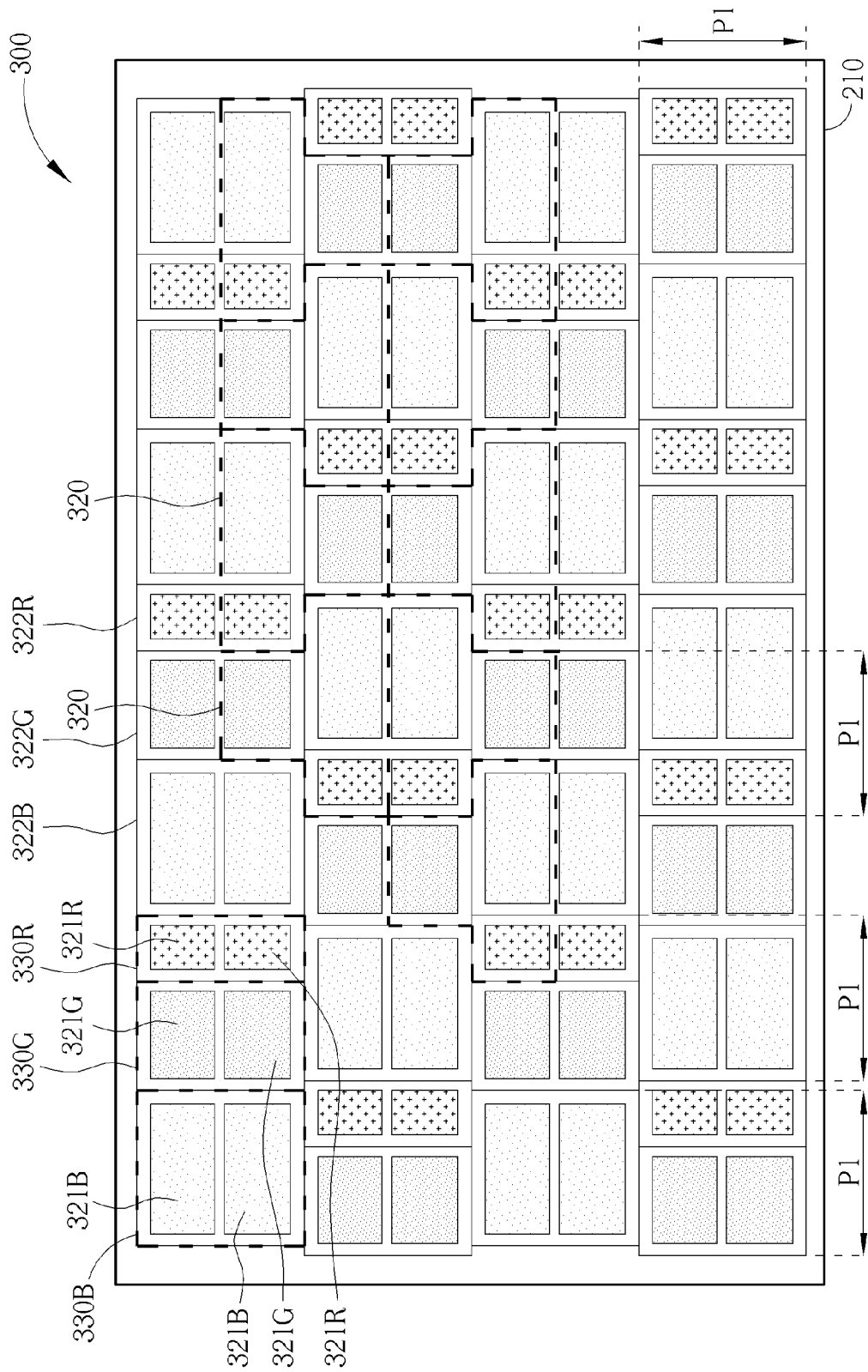
FIG. 10 is a schematic diagram illustrating a pixel structure of an electroluminescent display panel according to a third embodiment of the present invention.
Figure 11:
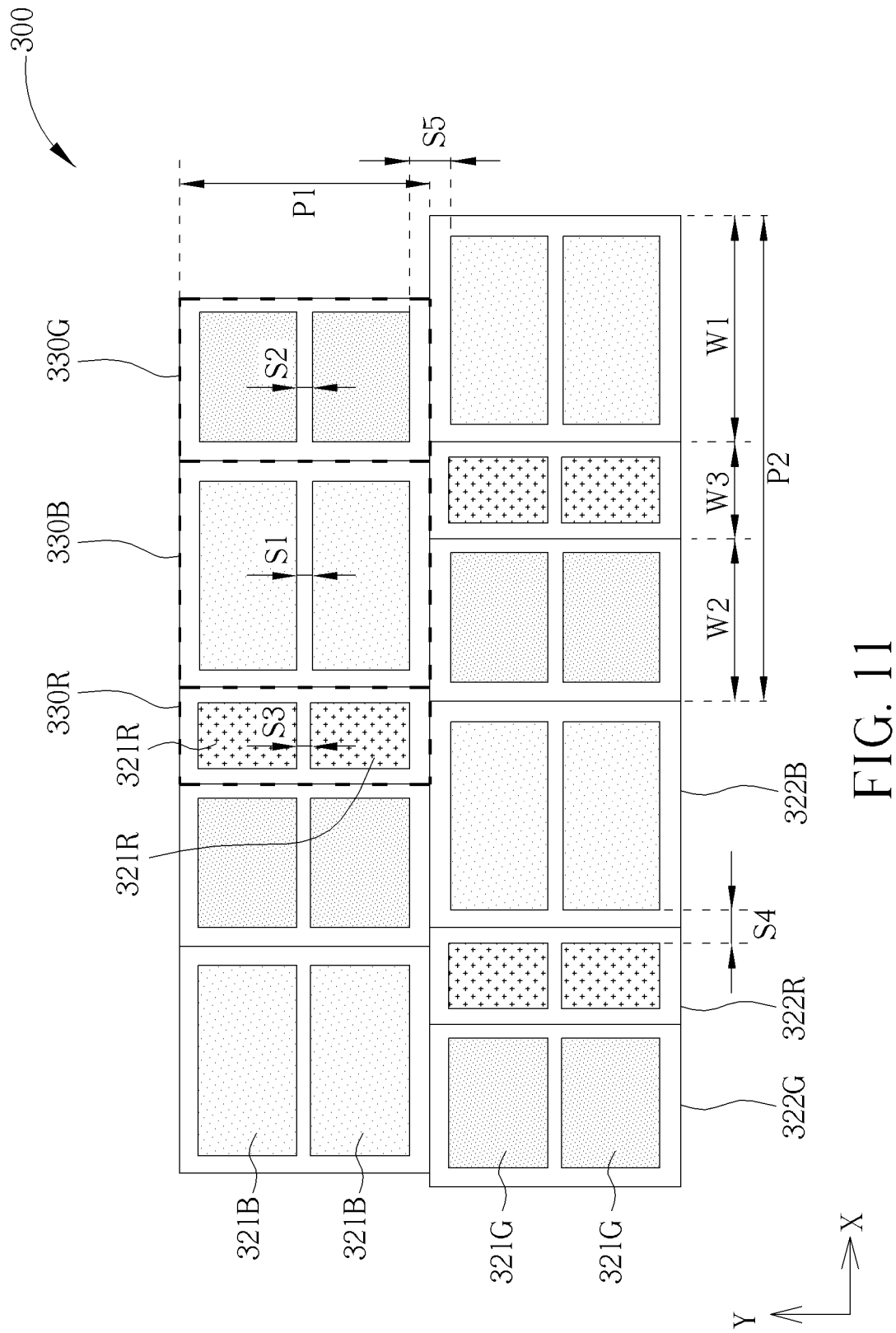
FIG. 11 is a schematic diagram illustrating a locally enlarged view of the pixel structure of the electroluminescent display panel according to the third embodiment.

Please refer to FIGS. 10 and 11. FIG. 10 is a schematic diagram illustrating a pixel structure of an electroluminescent display panel according to a third embodiment of the present invention. FIG. 11 is a schematic diagram illustrating a locally enlarged view of the pixel structure of the electroluminescent display panel according to the third embodiment. As shown in FIGS. 10 and 11, the pixel structure 300 of the electroluminescent display panel provided in this embodiment includes a substrate 210 and a plurality of display pixel units 320. The display pixel units 320 are disposed on the substrate 210. Each of the display pixel units 320 is composed of a first sub-pixel 321B, a second sub-pixel 321G and a third sub-pixel 321R. The first sub-pixel 321B, the second sub-pixel 321G and the third sub-pixel 321R of each of the display pixel units 320 are arranged in a delta arrangement. The display pixel units 320 are arranged by alternate regular delta arrangement and inverted delta arrangement in the row direction X, but not limited thereto. The first sub-pixel 321B of each of the display pixel units 320 is disposed adjacent to the first sub-pixel 321B of an adjacent display pixel unit 320 in a column direction Y (i.e., the first sub-pixel 321B of the adjacent display pixel unit 320 along a column direction Y). Two of the first sub-pixels 321B adjacent to each other (i.e., the two mutually adjacent first sub-pixels 321B) compose a first pixel unit 330B. The second sub-pixel 321G of each of the display pixel units 320 is disposed adjacent to the second sub-pixel 321G of an adjacent display pixel unit 320 in a column direction Y. Two of the second sub-pixels 321G adjacent to each other compose a second pixel unit 330G. The third sub-pixel 321R of each of the display pixel units 320 is disposed adjacent to the third sub-pixel 321R of an adjacent display pixel unit 320 in a column direction Y. Two of the third sub-pixels 321R adjacent to each other compose a third pixel unit 330R. The difference between this embodiment and the aforementioned first embodiment is that each of the first pixel units 330B, each of the second pixel units 330G and each of the third pixel units 330R have different widths along the row direction X respectively. In other words, preferably, each of the first pixel units 330B, each of the second pixel units 330G and each of the third pixel units 330R have different areas respectively so as to compensate for the brightness ratio and the difference in the emission efficiency among the sub-pixels of different colors. More specifically, each of the first pixel units 330B, each of the second pixel units 330G and each of the third pixel units 330R have the first width W1, the second width W2 and the third width W3 along the row direction X respectively. If the first sub-pixel 321B, the second sub-pixel 321G and the third sub-pixel 321R are respectively a blue sub-pixel, a green sub-pixel and a red sub-pixel, the first width W1 is preferably wider than the second width W2, and the second width W2 is preferably wider than the third width W3. In other words, the width of each of the first pixel units 330B along the row direction X is preferably wider than the width of each of the second pixel units 330G along the row direction X. Moreover, the width of each of the second pixel units 330G along the row direction X is preferably wider than the width of each of the third pixel units 330R along the row direction X. The area of each of the first pixel units 330B is preferably larger than the area of each of the second pixel units 330G. Moreover, the area of each of the second pixel units 330G is preferably larger than the area of each of the third pixel units 330R. It is worth noting that methods to adjust the area in the present invention is not limited to the aforementioned approaches and the area allocation of the sub-pixels of other colors may be modified as well to achieve and balance the required white points and the device duration.

Figure 12:
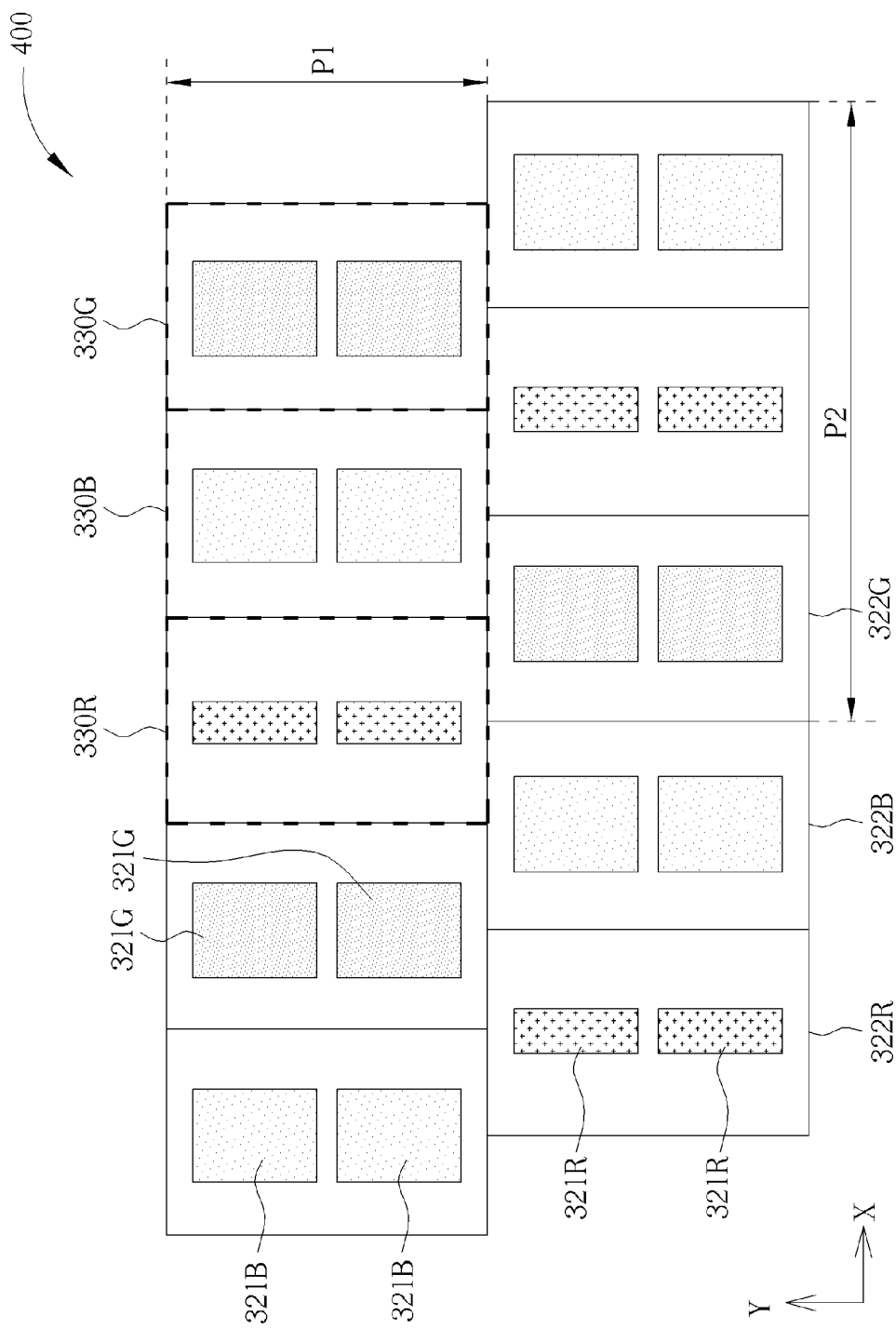
FIG. 12 is a schematic diagram illustrating a pixel structure of an electroluminescent display panel according to a fourth embodiment of the present invention.

Please refer to FIG. 12. FIG. 12 is a schematic diagram illustrating a pixel structure of an electroluminescent display panel according to a fourth embodiment of the present invention. As shown in FIG. 12, the pixel structure 400 of the electroluminescent display panel is provided in this embodiment. The difference between the fourth embodiment and the above-mentioned embodiments is that each of the first sub-pixels 321B does not align the second sub-pixel 321G adjacent to the first sub-pixel 321B nor the third sub-pixel 321R adjacent to the first sub-pixel 321B along the column direction Y. Each of the second sub-pixels 321G does not align the first sub-pixel 321B adjacent to the second sub-pixel 321G nor the third sub-pixel 321R adjacent to the second sub-pixel 321G along the column direction Y. Each of the third sub-pixels 321R does not align the first sub-pixel 321B adjacent to the third sub-pixel 321R nor the second sub-pixel 321G adjacent to the third sub-pixel 321R along the column direction Y. It is worth noting that, considering the alignment tolerance, as the solution of the pixel structure of the electroluminescent display panel in the present invention is increased, each of sub-pixels, preferably, does not align the other adjacent sub-pixels of other colors along the column direction Y. Accordingly, in the evaporation process, the deposited materials are prevented from being mixed, which results from the alignment precision and fabrication variation, and the yield loss may be improved. However, the present invention is not limited to this.

To sum up, because the sub-pixels arranged in a delta arrangement in each of the display pixel units and the adjacent sub-pixels of the same color compose a display pixel unit respectively, the alignment tolerance of the shadow mask increases in the evaporation process, the openings on the shadow mask are broadened, and the difficulty of fabricating the shadow mask is reduced. Moreover, by adjusting the distance between two sub-pixels in each of the display pixel units, or by adjusting the distribution of the color center of each sub-pixel in the display pixel unit, the shift issues among the pixel color centers (i.e., the color centers of white color) of the display pixel units are improved, and the display quality can be further enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A pixel structure of an electroluminescent display panel, comprising:
a substrate; and
a plurality of display pixel units, disposed on the substrate, wherein each of the display pixel units is composed of a first sub-pixel, a second sub-pixel and a third sub-pixel, and the first sub-pixel, the second sub-pixel and the third sub-pixel are arranged in a delta arrangement, wherein the first sub-pixel of each of the display pixel units is disposed adjacent to one first sub-pixel of an adjacent display pixel unit in a column direction, two of the first sub-pixels adjacent to each other compose a first pixel unit, the second sub-pixel of each of the display pixel units is disposed adjacent to the second sub-pixel of the adjacent display pixel unit in the column direction, two of the second sub-pixels adjacent to each other compose a second pixel unit, the third sub-pixel of each of the display pixel units is disposed adjacent to one third sub-pixel of an adjacent display pixel unit in the column direction, and two of the third sub-pixels adjacent to each other compose a third pixel unit,
wherein each of the first pixel units, each of the second pixel units and each of the third pixel units respectively have a first length identical to one another along the column direction, and the first pixel units disposed in any two adjacent rows are shifted relatively along a row direction by the first length.

2. The pixel structure of the electroluminescent display panel according to claim 1, wherein the second pixel units disposed in any two adjacent rows are shifted relatively along the row direction by the first length.

3. The pixel structure of the electroluminescent display panel according to claim 1, wherein the third pixel units disposed in any two adjacent rows are shifted relatively along the row direction by the first length.

4. The pixel structure of the electroluminescent display panel according to claim 1, wherein a center of each of the first pixel units is aligned with a center of a second pixel unit adjacent to the first pixel unit and a center of a third pixel unit adjacent to the first pixel unit.

5. The pixel structure of the electroluminescent display panel according to claim 1, wherein a width of each of the first pixel units, a width of each of the second pixel units and a width of each of the third pixel units along the row direction are equal to one another.

6. The pixel structure of the electroluminescent display panel according to claim 1, wherein an area of each of the first pixel units, an area of each of the second pixel units and an area of each of the third pixel units are equal to one another.

7. The pixel structure of the electroluminescent display panel according to claim 1, wherein a width of each of the third pixel units is different from a width of each of the first pixel units and a width of each of the second pixel units along the row direction.

8. The pixel structure of the electroluminescent display panel according to claim 1, wherein an area of each of the third pixel units is different from an area of each of the second pixel units and an area of each of the first pixel units.

9. The pixel structure of the electroluminescent display panel according to claim 1, wherein each of the first sub-pixels is a blue sub-pixel, each of the second sub-pixels is a green sub-pixel, and each of the third sub-pixels is a red sub-pixel.

10. The pixel structure of the electroluminescent display panel according to claim 9, wherein a width of each of the first pixel units along the row direction is larger than or equal to a width of each of the second pixel units along the row direction, and the width of each of the second pixel units along the row direction is larger than or equal to a width of each of the third pixel units along the row direction.

11. The pixel structure of the electroluminescent display panel according to claim 9, wherein an area of each of the first pixel units is larger than or equal to an area of each of the second pixel units, and the area of each of the second pixel units is larger than or equal to an area of each of the third pixel units.

12. The pixel structure of the electroluminescent display panel according to claim 1, wherein each of the first pixel units, a second pixel unit adjacent to the first pixel unit along the row direction and a third pixel unit adjacent to the first pixel unit along the row direction constitute a second length, and the second length is twice as long as the first length.

13. The pixel structure of the electroluminescent display panel according to claim 1, wherein a first spacing exists between the first sub-pixels of each of the first pixel units, a second spacing exists between the second sub-pixels of each of the second pixel units, a third spacing exists between the third sub-pixels of each of the third pixel units, the second spacing is wider than or equal to the third spacing, and the third spacing is wider than or equal to the first spacing.

14. The pixel structure of the electroluminescent display panel according to claim 13, wherein the second spacing is wider than the third spacing.

15. The pixel structure of the electroluminescent display panel according to claim 13, wherein a fourth spacing exists between each of the first sub-pixels and a second sub-pixel adjacent to the first sub-pixel along the row direction or between each of the first sub-pixels and a third sub-pixel adjacent to the first sub-pixel along the row direction, and the first spacing is smaller than the fourth spacing.

16. The pixel structure of the electroluminescent display panel according to claim 13, wherein a fifth spacing exists between each of the first sub-pixels and a second sub-pixel adjacent to the first sub-pixel along the column direction or between each of the first sub-pixels and a third sub-pixel adjacent to the first sub-pixel along the column direction, and the first spacing is smaller than the fifth spacing.

17. The pixel structure of the electroluminescent display panel according to claim 1, wherein each of the first sub-pixels has a first color center, each of the second sub-pixels has a second color center, each of the third sub-pixels has a third color center, a first distance exists along the column direction between the two first color centers in two display pixel units adjacent to each other along the row direction, a second distance exists along the column direction between the two second color centers in the two display pixel units adjacent to each other along the row direction, a third distance exists along the column direction between the two third color centers in the two display pixel units adjacent to each other along the row direction, the second distance is shorter than or equal to the third distance, and the third distance is shorter than or equal to the first distance.

18. The pixel structure of the electroluminescent display panel according to claim 17, wherein the second distance is shorter than the third distance.

19. The pixel structure of the electroluminescent display panel according to claim 1, wherein each of the display pixel units has a pixel color center, and the pixel color centers of two display pixel units adjacent to each other along the row direction are shifted relatively along the column direction.

20. The pixel structure of the electroluminescent display panel according to claim 1, wherein each of the display pixel units has a pixel color center, and the pixel color centers of two display pixel units adjacent to each other along the row direction are substantially aligned along a straight line parallel to the row direction.

21. The pixel structure of the electroluminescent display panel according to claim 1, wherein the display pixel units are arranged by alternate regular delta arrangement and inverted delta arrangement.

22. The pixel structure of the electroluminescent display panel according to claim 1, wherein each of the first sub-pixels does not align a second sub-pixel adjacent to the first sub-pixel nor a third sub-pixel adjacent to the first sub-pixel along the column direction, each of the second sub-pixels does not align the first sub-pixel adjacent to the second sub-pixel nor a third sub-pixel adjacent to the second sub-pixel along the column direction, and each of the third sub-pixels does not align the first sub-pixel adjacent to the third sub-pixel nor the second sub-pixel adjacent to the third sub-pixel along the column direction.

23. The pixel structure of the electroluminescent display panel according to claim 1, wherein each of the first sub-pixels, each of the second sub-pixels and each of the third sub-pixels respectively comprise a rectangle sub-pixel.

* * * * *